United States Patent [19]

Kronberg

[11] Patent Number: 4,945,953

[45] Date of Patent: Aug. 7, 1990

[54] SURFACE MOUNT COMPONENT JIG

[75] Inventor: James W. Kronberg, Beech Island, S.C.

[73] Assignee: The United States of America as represented by the United States Department of Energy, Washington, D.C.

[21] Appl. No.: 346,761

[22] Filed: May 2, 1989

[51] Int. Cl.⁵ .............................................. B21F 11/00
[52] U.S. Cl. ....................................... 140/105; 72/325
[58] Field of Search .................... 140/105, 106; 72/325

[56] References Cited

U.S. PATENT DOCUMENTS

| | | | |
|---|---|---|---|
| 1,005,980 | 10/1911 | Katzinger . | |
| 3,348,405 | 10/1967 | Johnson | 72/325 |
| 3,379,046 | 4/1968 | Glenn | 72/401 |
| 3,406,558 | 10/1968 | Tillmann et al. | 72/416 |
| 3,477,575 | 6/1969 | Johanson | 140/106 |
| 3,692,069 | 9/1972 | Clendennen et al. | 140/106 |
| 4,033,388 | 7/1977 | Ruegger | 140/106 |
| 4,470,289 | 9/1984 | Sinclair et al. | 72/401 |
| 4,544,003 | 10/1985 | Bumann et al. | 140/147 |
| 4,727,912 | 3/1988 | Gonzoles | 140/147 |

FOREIGN PATENT DOCUMENTS

| | | | |
|---|---|---|---|
| 28029 | 2/1987 | Japan | 72/702 |
| 108919 | 5/1988 | Japan | 140/105 |

Primary Examiner—Lowell A. Larson
Attorney, Agent, or Firm—Stephen D. Hamel; William R. Moser; Richard E. Constant

[57] ABSTRACT

A device for bending and trimming the pins of a dual-inline-package component and the like for surface mounting rather than through mounting to a circuit board comprises, in a first part, in pin cutter astride a holder having a recess for holding the component, a first spring therebetween, and, in a second part, two flat members pivotally interconnected by a hinge and urged to an upward peaked position from a downward peaked position by a second spring. As a downward force is applied to the pin cutter it urges the holder downward, assisted by the first spring and a pair of ridges riding on shoulders of the holder, to carry the component against the upward peaked flat members which guide the pins outwardly. As the holder continues downwardly, the flat members pivot to the downward peaked position bending the pins upwardly against the sides of the holder. When the downward movement is met with sufficient resistance, the ridges of the pin cutter ride over the holder's shoulders to continue downward to cut any excess length of pin.

3 Claims, 2 Drawing Sheets

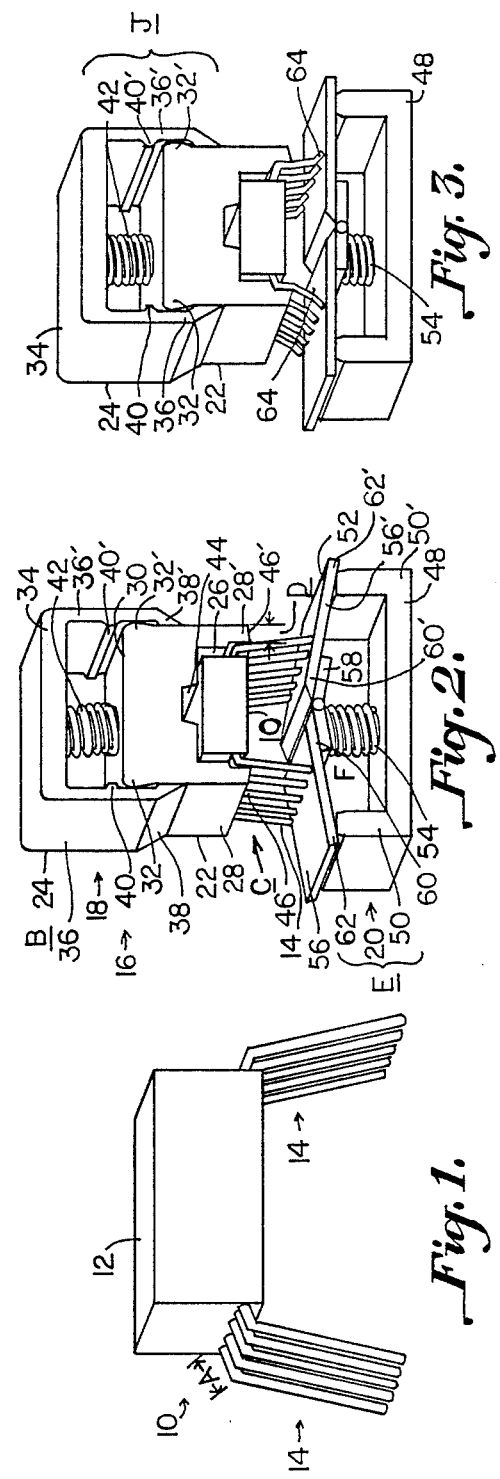
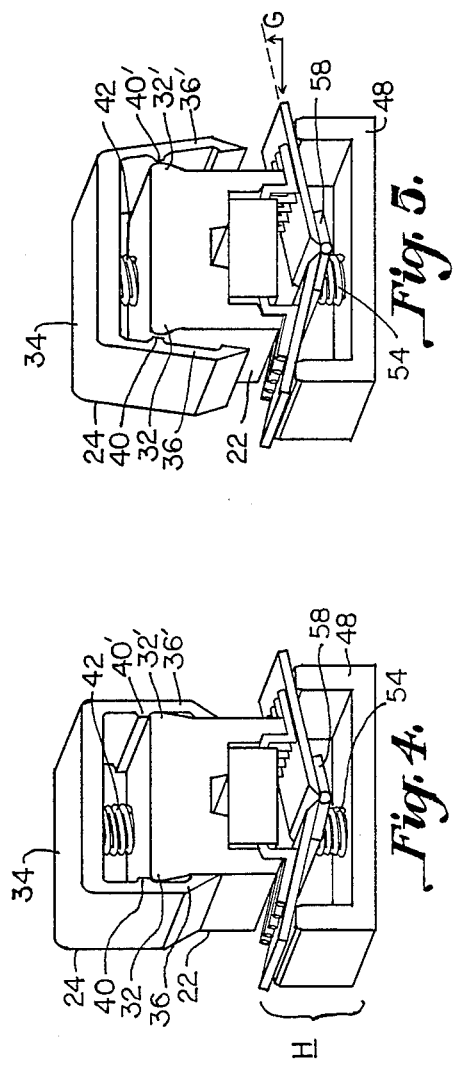

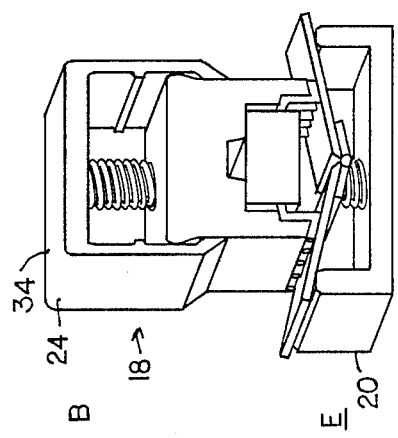
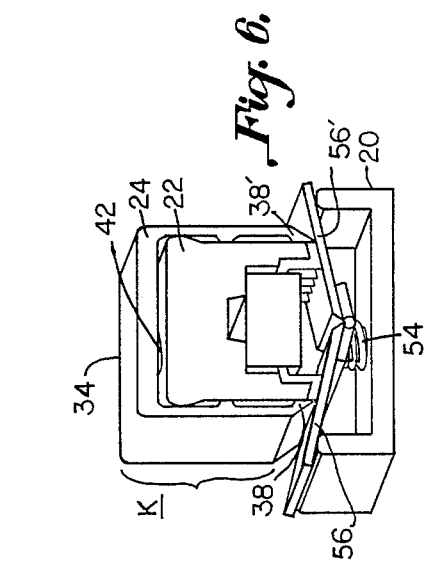
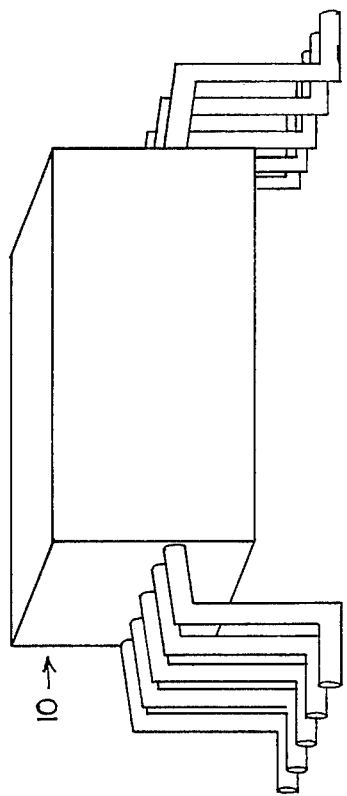
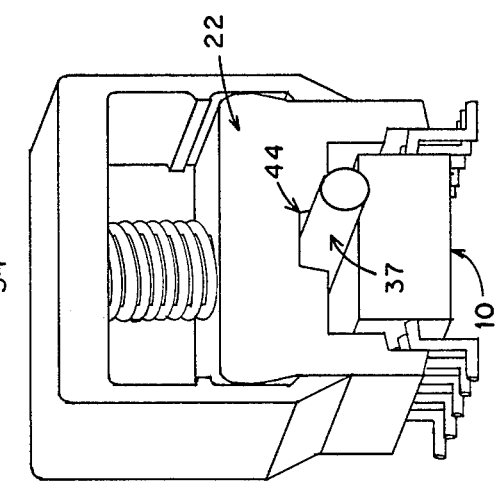

SURFACE MOUNT COMPONENT JIG

FIELD OF THE INVENTION AND CONTRACT STATEMENT

The present invention relates to forming jigs for bending the pins of a dual-inline-package (DIP) components, and the like, for mounting to the surface of a circuit board. The United States Government has rights in this invention pursuant to Contract No. DE-AC09-76SR00001 between the U.S. Department of Energy and E.I. DuPont de Nemours & Co.

BACKGROUND OF THE INVENTION

Discussion of Background and Prior Art

A dual-inline-package, or DIP, is an electronic circuit component used in integrated circuitry typically comprising a microchip wafer embedded in an epoxy block. Thin wires are attached to terminals of the embedded wafer and extend to the outside of the block at intervals. Usually these wires, or pins, are bent at right angles to a vertical position a short distance after they exit the block so that they can be pushed through holes in the circuit board and soldered to the other side where conducting paths interconnect the soldered pins to other components as desired.

More recently, to save space, DIP components are being "surface mounted" on both sides of a circuit board; that is, a DIP component is soldered to the same side of the circuit board rather than "through mounted". In order to facilitate surface mounting, the pins must have a second right angle bend so that the end portion of the pins is horizontal, parallel to the surface of the circuit board, and any excess length of the end portion of the pins trimmed for convenience in arranging the DIP component with other circuitry and components.

Although many new DIP components are being manufactured in a form suitable for surface mounting, many DIP components exist in through-mounting form. Furthermore, it is not uncommon to find that the pins are not in perfect alignment: to begin with one or more misaligned pins in an array of pins. Existing jigs for bending DIP components, such as that embodying the invention claimed by Ruegger in U.S. Pat. No. 4,033,388 issued 07/1977, do not address the problem of bending for surface mounting DIP component pins already bent for through mounting or the problem of any misaligned pins. Furthermore, the bend produced by the Ruegger jig depends on the way the DIP component is positioned in the jig.

SUMMARY OF THE INVENTION

An object of the invention is to provide a jig for bending the pins of a DIP component from a through mounting configuration to a surface mounting configuration.

A further object of the invention is to provide a jig for cutting an excess length of the end portion of the pin array of a DIP component.

A still further object of the invention is to provide a jig for bending the pins of DIP components from a through mounting configuration to a surface mounting configuration that accommodates any individual misaligned pins.

Yet another object of the invention is to provide a jig for bending the pins of DIP components with a slight over bend to compensate for spring back of the pins so that upon being released from the jig, an end portion of the pin array is parallel to the surface of the circuit board to which the DIP component is to be soldered.

To achieve the foregoing and other objects and in accordance with the purpose of the invention, as embodied and broadly described herein, the invention comprises a two part jig having a first part for holding the DIP component and trimming the excess pins material and a second part that collects misaligned pins with the pin array and guides the pins outwardly, forms the bend by partially collapsing and then overbends the ends of the pins. The jig can be affixed to the jaws of a hand tool or be attached to a press.

The present invention bends DIP component pins generally aligned for through mounting to pins uniformly and precisely aligned and cut for surface mounting. The bending is gentle so as not to damage the DIP component and performed in one motion.

Reference is now made in detial to the present preferred embodiment of the invention, an example of which is given in the accompanying drawings.

A BRIEF DESCRIPTION OF THE DRAWINGS

The accompanying drawings, which are incorporated in and form a part of the specification, illustrate the invention and, together with the description, serve to explain the principles of the invention. In the drawings:

FIG. 1 illustrates in perspective a Dual-Inline-Package (DIP) with its pins bent for through mounting.

FIG. 2 is a cross-sectional side view of the present invention with the DIP in position before the bending process.

FIG. 3 is a cross-sectional side view of the present invention with the DIP in position and with the bending process begun.

FIG. 4 is a cross-sectional side view of the present invention with the DIP in position and with the bend completely formed.

FIG. 5 is a cross sectional side view of the present invention with the DIP in position and with the pin cutters descending to cut the excess pin lengths.

FIG. 6 is a cross-sectional side view of the present invention with the DIP in position and with the pin cutters cutting the excess pin lengths.

FIG. 7 is a cross-sectional side view of the present invention with the DIP in position and with the pin cutters ascending.

FIG. 8 is a cross-sectional side view of the present invention with the DIP in position and the bending and trimming complete.

FIG. 9 illustrates in perspective the DIP after bending and trimming.

DETAILED DESCRIPTION OF THE INVENTION

The present invention is a two part jig for bending the pins of a Dual-Inline-Package (DIP) component. The DIP component is placed in one part of the jig and that part is pressed down on the second part causing the end portion of the pin array to be guided outwardly, bent and any excess length not needed for surface mounting cut.

Referring to FIG. 1, a DIP component 10 comprises a microchip wafer (not shown) inside an epoxy block 12. An array of pins 14, which are fine, usually flat wires, are connected to portions of the microchip wafer and extend horizontally out of epoxy block 12 where they are bent downward at right angles a distance A from the side of DIP component 10 for conventional mounting to a circuit board by pushing the array of pins 14 through holes in the board and soldering the pins 14 on the other side of the board.

FIG. 2 shows a side view of the present jig 16 with a DIP component 10 shown in place prior to a bending and cutting operation. DIP components have two arrays of pins, one on each side, but it will be obvious that a jig can be fashioned for a package of analogous form having a pin array on each of four sides.

Jig 16 has a first part indicated generally at 18 and a second part indicated generally at 20. First part 18 comprises a holder 22 and a pin cutter 24 astride holder 22. Holder 22 has a recess 26 for receiving DIP component 10 which recess 26 is defined by two sides 28 and 28' on either of side of DIP component 10. Holder 22 has an enlarged upper surface 30 having shoulders 32 and 32'

Pin cutter 24 has an upper surface 34 having two dependant cutter bars 36 and 36' each having a blade 38 and 38' and ridge 40 and 40', respectively. Cutter bars 36 and 36' ride on shoulders 32 and 32' as pin cutter 24 moves up and down. Pressure on upper surface 34 is transferred to holder 22 through ridges 40 and 40' engaging shoulders 32 and 32', respectively, causing holder 22 to move downward as pin cutter 24 moves downward so long as the downward force is not met with too much upward resistance. Further downward pressure on upper surface 34 of pin cutter 24, as best seen in FIG. 4, causes ridges 40 and 40' to ride over shoulders 32 and 32' flaring cutter bars 36 and 36' laterally as shown in FIG. 5 and allowing pin cutter 24 to move downward with respect to holder 22.

A first biasing means 42 urges pin cutter 24 and holder 22 apart to an at rest position B as shown in FIG. 2 with shoulders 32 and 32' between blades 38 and 38' and ridges 40 and 40', respectively.

A channel 44 approximately centered on recess 26 allows insertion of a tool, such as a screw driver tip 37 as illustrated in FIG. 8, between holder 22 and DIP component 10 to facilitate removal of DIP component 10 through a wedging or lever type action forcing the holder and component apart.

A lower face 46 and 46' on each side 28 and 28', respectively, is formed at an angle C to overbend pin array 14 and a width D to define the length of the end portion of pin array 14 needed for soldering to the surface of a circuit board.

Second part 20 comprises a base 48 having two upstanding sides 50 and 50', a flexing pin guide 52 and a second biasing means 54 urging flexing pin guide 52 apart from base 48 to rest position E. Flexing pin guide 52 further comprises two flat members 56 and 56' pivotally interconnected by a hinge means 58 at one end 60 and 60' each and resting on upstanding sides 50 and 50', respectively, at an opposing end 62 and 62' so that, when second part 20 is in at rest position E, flat members 56 and 56' are oriented at an upward peaked position, angle F, as seen in FIG. 2. Downward pressure on flexing pin guide 52 in at rest position E pivots flat members 56 and 56' about hinge means 58 from angle F downward against second spring 54 until flat members 56 and 56' are at a downward peaked position, angle G, as best seen in FIG. 4, and second part 20 is in compressed position H so that an end portion 64 of pin array 14, including any inwardly misaligned individual pins, is urged outwardly while downward pressure on flexing pin guide 52 is matched by the upward pressure exerted by base 48 and second spring 54.

Comparing FIGS. 2 and 3, pin cutter 24, urged downward by pressure on it upper surface 34 leaves at rest positin B, traveling downward with respect to holder 22 until ridges 40 and 40' of cutter bars 36 and 36' engage shoulders 32 and 32', respectively, and carry holder 22 along with pin cutter 24 until first part is in intermediate position J and jig 16 has caused an end portion 64 of pin array to be bent. As best seen by comparing FIGS. 4 and 5, further downward pressure on upper surface 34 causes ridges 40 and 40' to ride over shoulders 32 and 32' respectively, and pin cutter 24 to travel downward with respect to holder 22 unitl, as shown in FIG. 6, blades 38 and 38', cutting through any excess length of end portion 64, rest on flat members 56 and 56', respectively, and the upward force of first biasing means 42, holder 22 and second part 20 match the downward force on upper surface 34. First part 18 is in compressed position K. Comparing FIGS. 7 and 8, removing the downward force on upper surface 34 of pin cutter 24 allows first part 18 to return to at rest position B and second part 20 to return to at rest position E.

As seen in FIG. 9, the DIP component is now formed for surface mounting to a circuit board.

First part 18 and second part 20 of jig 16 can be fitted to the two opposing jaws of a hand tool adapted to receive them and bring the two parts together in alignment and with sufficient force. Alternatively, a hand press can be fashioned to hold the two parts in alignment.

First and second biasing means, 42 and 54, respectively, can be coil springs or other resilient means. It is important that ridges 40 and 40' not ride over shoulders 32 and 32' until second biasing means 54 and flexing pin guide 52 move from at rest position E and angle F to compressed position H and angle G so that end portion 64 is fully bent before excess length of end portion 64 is cut. Furthermore, it is important that angle F guide end portion 64 including any individual misaligned pins outward at the start of the bend, and the angle G provide a sufficient overbend so that end portion 64 of pin array 14 spring back to horizontal to the surface of the circuit board to which it will be attached when DIP component 10 is removed from jig 16.

The foregoing description of preferred embodiments of the invention has been presented for purposes of illustion and description. It is not intended to be exhaustive or to limit the invention to the precise form disclosed, and obviously many modifications and variations are possible in light of the above teachings. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. A device for bending an end portion of an array of pins extending from a dual-inline-package electrical circuit component, and the like, and cutting an excess length from said end portion so that said component can be conveniently mounted to a same surface rather than to an opposing surface of a circuit board wherein said device comprises a means for holding said component so that said array can be bent, said holding means having two shoulders each having a side extending downwardly so as to form a recess for holding said component between said sides and having a means for releasing said component from said holding means;

a pin cutting means positioned astride said holding means for cutting an excess length of end portion, said pin cutting means having dependant cutter bars with blades at distal ends, said cutter bars flanking said sides of said holding means;

said pin cuttig means having a first biasing means for urging said holding means and said pin cutting means apart;

said cutter bars having ridges engaging said shoulders of said holding means so that a force applied to said pin cutting means to move said pin cutting means downward is transferred by said ridges to said shoulders and by said first biasing means to said holding means so that said holding means moves downwards with said pin cutting means; and a means for guiding and bending said end portion positioned opposite said holding means so that when said holding means and said guiding and bending means are brought together said end portion is guided outwardly and bent upwardly past a horizontal position, said guiding and holding means having two flat members pivotally interconnected so that said two flat members can move from an upward peaked position to a downward peaked position;

said guiding and bending means having a second biasing means urging said two flat members toward said upward peaked position from said downward position so that as said holding means and said guiding and bending means are brought together, said end portion, first engages said flat members in said upward peaked position, and is guided outwardly, and said end portion, said flat members moving to said downward peaked position under force applied by said holding means being brought together with said guiding and bending means, is bent upwardly against said sides of said holding means.

2. The device of claim 1 wherein said ridges of said cutter bars ride over said shoulders of said holding means, said cutter bars flaring outwardly, as said force is applied after said holding means and said güiding and bending means have been brought together so that said cutter bars can cut said end portion.

3. A device for bending an end portion of an array of pins extending from a dual-inlnine-package electrical circuit components, and the like, and cutting an excess length from said end portion so that said component can be conveniently mounted to a same surface rather than to an opposing surface of a circuit board wherein said device comprises.

a means for holding said component so that said end portion of said array may be bent and said excess length of said end portion may be cut;

a pin guiding and bending means opposing said holding means for guiding said end portion including any individual misaligned pins into postion for bending and for bending said end portion as said holding means and said guiding and bending means are brought together, said guiding and bending means overbending said end portion slightly so that said end portion will be parallel to said same surface when said end portion springs back upon being removed from said holding means; said guiding and bending means furthe comprising a base, two flat members attached attached to said base and pivotally interconnected by a hinge means so that said flat members can move from an upward peaked position for guiding said end portion outwardly to a downward peaked position for bending said end portion against said faces of said holding means, and a second biasing means for urging said flat members to said first position from said second position; and a pin cutting means positioned adjacent said holding means for cutting said excess length from said end portion so that said component can be conveniently attached to said same surface.

* * * * *